(12) United States Patent
Ou et al.

(10) Patent No.: US 10,224,349 B1
(45) Date of Patent: Mar. 5, 2019

(54) METHOD OF MANUFACTURING TFT ARRAY SUBSTRATE AND DISPLAY DEVICE

(71) Applicant: Shenzhen China Star Optoelectronics Semiconductor Display Technology Co., Ltd., Shenzhen, Guangdong (CN)

(72) Inventors: Tian Ou, Shenzhen (CN); Zhixiong Jiang, Shenzhen (CN)

(73) Assignee: SHENZHEN CHINA STAR OPTOELECRONICS SEMICONDUCTOR DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/743,292

(22) PCT Filed: Jan. 4, 2018

(86) PCT No.: PCT/CN2018/071273
§ 371 (c)(1),
(2) Date: Jan. 10, 2018

(30) Foreign Application Priority Data

Dec. 5, 2017 (CN) .......................... 2017 1 1264583

(51) Int. Cl.
*H01L 27/12* (2006.01)
(52) U.S. Cl.
CPC ........ *H01L 27/1288* (2013.01); *H01L 27/127* (2013.01); *H01L 27/1222* (2013.01); *H01L 27/1262* (2013.01)

(58) Field of Classification Search
None
See application file for complete search history.

(56) References Cited

U.S. PATENT DOCUMENTS

| | | | |
|---|---|---|---|
| 9,947,870 B2 * | 4/2018 | Kwon | H01L 51/0016 |
| 2011/0232954 A1 * | 9/2011 | Sirringhaus | H01L 51/0016 174/260 |
| 2013/0075768 A1 * | 3/2013 | Kim | H01L 51/0016 257/88 |
| 2017/0025610 A1 * | 1/2017 | Kwon | H01L 51/0007 |
| 2018/0211985 A1 * | 7/2018 | Zhao | H01L 27/1214 |

* cited by examiner

*Primary Examiner* — Mounir S Amer
(74) *Attorney, Agent, or Firm* — Emerson, Thomson & Bennett, LLC; Roger D. Emerson

(57) ABSTRACT

A method of manufacturing an array substrate and a display device includes forming a water-soluble organic layer on a surface of a passivation layer, forming a photoresist layer on a surface of the water-soluble organic layer to perform a yellow light process to form a photoresist layer pattern, a cross-section of a water-soluble organic area is less than a cross-section of a bottom surface of a photoresist area, and dry etching the passivation layer such that a cross-section of the passivation layer pattern is the same as a cross-section of the water-soluble organic layer pattern.

14 Claims, 3 Drawing Sheets

METHOD OF MANUFACTURING TFT ARRAY SUBSTRATE AND DISPLAY DEVICE

FIELD OF INVENTION

The present disclosure relates to the field of display technologies, and more particularly to a method of manufacturing an array substrate and a display device.

BACKGROUND OF INVENTION

Thin film transistor-liquid crystal displays (TFT-LCDs) are currently the most widely used flat panel displays. As technologies for manufacturing liquid crystal panels are maturing and advancing, simplifying manufacturing processes, shortening the manufacturing processes, and improving efficiency of the manufacturing processes are important ways to reduce production costs so as to survive in fierce competition in the industry. Therefore, manufacturing a TFT-LCD array substrate structure using three photolithography processes has come into being.

The three photolithography processes are combined with a peeling process of a transparent electrode using a halftone mask based on four photolithography processes. After tunneling a passivation layer, the transparent electrode is directly formed without removing a photoresist. The photoresist is removed after forming the transparent electrode. Difficulty of the peeling process of the transparent electrode is that the photoresist is covered with the transparent electrode. The photoresist can only be peeled from an undercut area not covered by the transparent electrode using a stripping solution. In the area where the undercut is small, the peeling efficiency is low and the photoresist remains, thereby affecting panel quality.

SUMMARY OF INVENTION

An object of the present disclosure is to provide a method of manufacturing an array substrate and a display device capable of solving the problem that a peeling area where stripping solution contacts is small during a peeling process of a transparent electrode, such that the efficiency of peeling the photoresist from the transparent electrode is low which increases peeling time.

To achieve the above object, an aspect of the present disclosure provides a method of manufacturing an array substrate, including:

a step S10 of providing a substrate;

a step S20 of depositing a passivation layer on a surface of the substrate;

a step S30 of forming a water-soluble organic layer on a surface of the passivation layer, wherein the water-soluble organic layer is made of water-soluble organic material including one or at least two of a hydroxyl group, an aldehyde group, a carboxyl group, an amino group, and a sulfonic acid group;

a step S40 of coating a photoresist layer on a surface of the water-soluble organic layer, exposing and developing the photoresist layer to form a photoresist layer pattern and a water-soluble organic layer pattern, wherein the photoresist layer pattern includes a plurality of photoresist areas disposed at intervals, the water-soluble organic layer pattern includes a plurality of water-soluble organic areas disposed at intervals, each of the photoresist areas is disposed on one of the water-soluble organic areas, and a cross-section of the water-soluble organic area is less than a cross-section of a bottom surface of the photoresist area;

a step S50 of dry etching the passivation layer such that a cross-section of the passivation layer pattern is the same as a cross-section of the water-soluble organic layer pattern;

a step S60 of depositing a transparent electrode on the substrate, wherein the transparent electrode includes a first electrode covering the surface of the substrate and a second electrode covering a surface of the photoresist layer pattern; and a step S70 of peeling off the water-soluble organic layer pattern and the photoresist layer pattern, and removing the second electrode to pattern the transparent electrode.

In an embodiment of the present disclosure, the water-soluble organic material is composed of 3,4-ethylenedioxythiophene polymer and polystyrene sulfonate.

In an embodiment of the present disclosure, when exposing and developing the photoresist layer, a lateral etching of the water-soluble organic area using a developer causes the cross-section of the water-soluble organic area to be less than a cross-section of the photoresist area, the photoresist area has a trapezoidal shape, and a top cross-section of the photoresist area is less than a bottom cross section of the photoresist area.

In an embodiment of the present disclosure, the step S50 includes: etching the passivation layer using an etching gas such that the cross-section of the passivation layer pattern is the same as the cross-section of the water-soluble organic layer pattern, while etching the water-soluble organic layer using the etching gas such that the cross-section of the water-soluble organic layer pattern is further reduced.

In an embodiment of the present disclosure, the step S70 includes: peeling off the water-soluble organic layer pattern, the photoresist layer pattern, and the second electrode using a stripping solution, wherein the water-soluble organic layer pattern is dissolved in the stripping solution.

Another aspect of the present disclosure further provides a method of manufacturing a display device including a method of manufacturing an array substrate and a method of manufacturing a color filter substrate, the method of manufacturing the array substrate includes:

a step S10 of providing a substrate;

a step S20 of depositing a passivation layer on a surface of the substrate;

a step S30 of forming a water-soluble organic layer on a surface of the passivation layer, wherein the water-soluble organic layer is made of water-soluble organic material;

a step S40 of coating a photoresist layer on a surface of the water-soluble organic layer, exposing and developing the photoresist layer to form a photoresist layer pattern and a water-soluble organic layer pattern, wherein the photoresist layer pattern includes a plurality of photoresist areas disposed at intervals, the water-soluble organic layer pattern includes a plurality of water-soluble organic areas disposed at intervals, each of the photoresist areas is disposed on one of the water-soluble organic areas, and a cross-section of the water-soluble organic area is less than a cross-section of a bottom surface of the photoresist area;

a step S50 of dry etching the passivation layer such that a cross-section of the passivation layer pattern is the same as a cross-section of the water-soluble organic layer pattern;

a step S60 of depositing a transparent electrode on the substrate, wherein the transparent electrode includes a first electrode covering the surface of the substrate and a second electrode covering a surface of the photoresist layer pattern; and a step S70 of peeling off the water-soluble organic layer and the photoresist layer, and removing the second electrode to pattern the transparent electrode.

In an embodiment of the present disclosure, the water-soluble organic material includes one or at least two of a hydroxyl group, an aldehyde group, a carboxyl group, an amino group, and a sulfonic acid group.

In an embodiment of the present disclosure, the water-soluble organic material is composed of 3,4-ethylenedioxythiophene polymer and polystyrene sulfonate.

In an embodiment of the present disclosure, when exposing and developing the photoresist layer, a lateral etching of the water-soluble organic area using a developer causes the cross-section of the water-soluble organic area to be less than a cross-section of the photoresist area, the photoresist area has a trapezoidal shape, and a top cross-section of the photoresist area is less than a bottom cross section of the photoresist area.

An aspect of the present disclosure provides a method of manufacturing an array substrate, including:

a step S10 of providing a substrate;

a step S20 of depositing a passivation layer on a surface of the substrate;

a step S30 of forming a water-soluble organic layer on a surface of the passivation layer, wherein the water-soluble organic layer is made of water-soluble organic material;

a step S40 of coating a photoresist layer on a surface of the water-soluble organic layer, exposing and developing the photoresist layer to form a photoresist layer pattern and a water-soluble organic layer pattern, wherein the photoresist layer pattern includes a plurality of photoresist areas disposed at intervals, the water-soluble organic layer pattern includes a plurality of water-soluble organic area disposed at intervals, each of the photoresist areas is disposed on one of the water-soluble organic areas, and a cross-section of the water-soluble organic area is less than a cross-section of a bottom surface of the photoresist area;

a step S50 of dry etching the passivation layer such that a cross-section of the passivation layer pattern is the same as a cross-section of the water-soluble organic layer pattern;

a step S60 of depositing a transparent electrode on the substrate, wherein the transparent electrode includes a first electrode covering the surface of the substrate and a second electrode covering a surface of the photoresist layer pattern; and a step S70 of peeling off the water-soluble organic layer pattern and the photoresist layer pattern, and removing the second electrode to pattern the transparent electrode.

In an embodiment of the present disclosure, the water-soluble organic material is composed of 3,4-ethylenedioxythiophene polymer and polystyrene sulfonate.

In an embodiment of the present disclosure, when exposing and developing the photoresist layer, a lateral etching of the water-soluble organic area using a developer causes the cross-section of the water-soluble organic area to be less than a cross-section of the photoresist area, the photoresist area has a trapezoidal shape, and a top cross-section of the photoresist area is less than a bottom cross section of the photoresist area.

In an embodiment of the present disclosure, the step S50 includes: etching the passivation layer using an etching gas such that the cross-section of the passivation layer pattern is the same as the cross-section of the water-soluble organic layer pattern, while etching the water-soluble organic layer using the etching gas such that the cross-section of the water-soluble organic layer pattern is further reduced.

In an embodiment of the present disclosure, the step S70 includes: peeling off the water-soluble organic layer pattern, the photoresist layer pattern, and the second electrode using a stripping solution, wherein the water-soluble organic layer pattern is dissolved in the stripping solution.

An embodiment of the present invention provides the method of manufacturing the array substrate and the method of manufacturing the display device. The water-soluble organic layer is disposed on the surface of the passivation layer to increase an area of a peeling area such that the stripping solution can dissolve the water-soluble organic layer. The photoresist and the transparent electrode covering the water-soluble organic layer enhance peeling efficiency of the transparent electrode.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
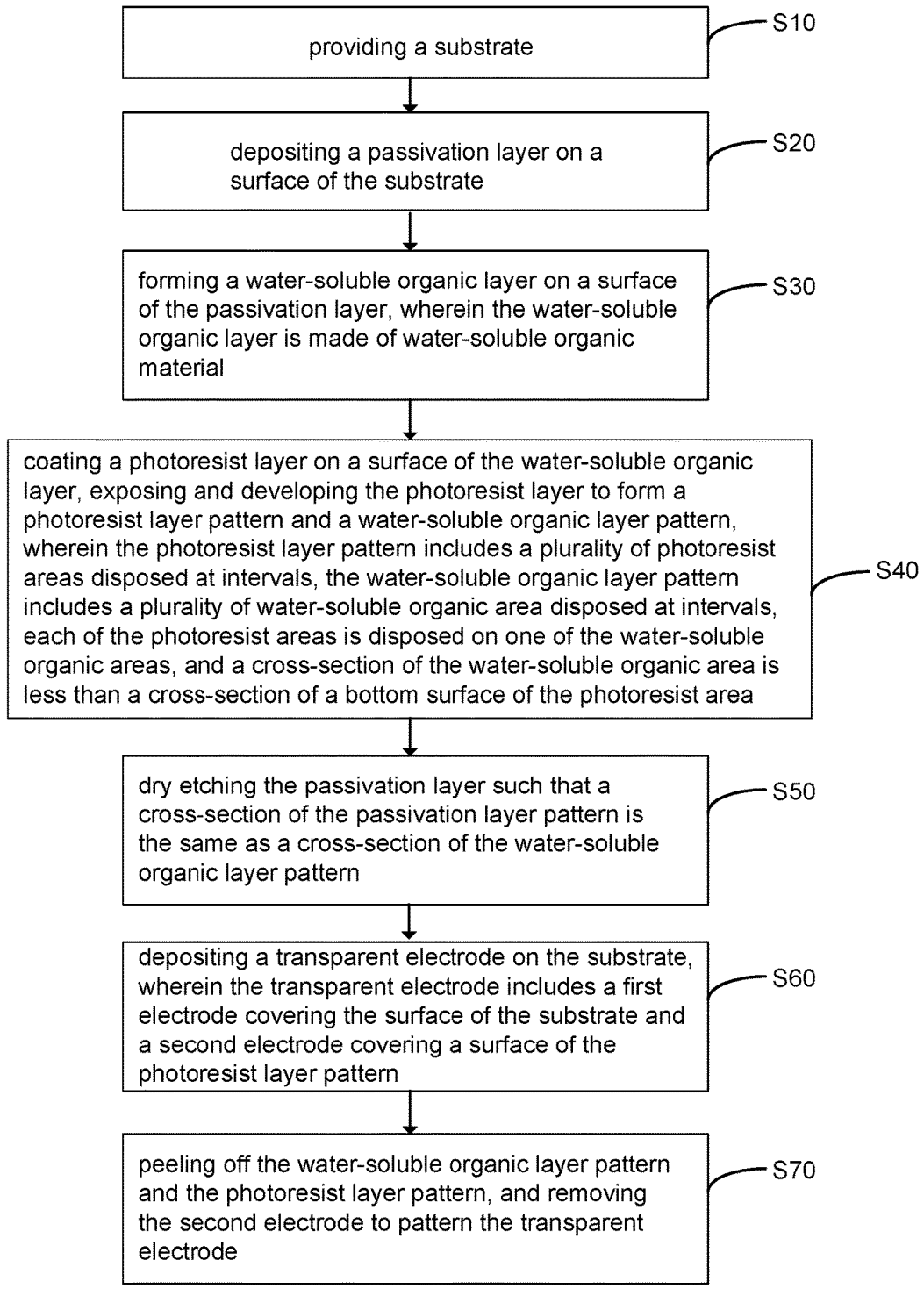
FIG. 1 is a flowchart of a method for manufacturing an array substrate according to an embodiment of the present disclosure.

The embodiments described herein with reference to the accompanying drawings are explanatory, illustrative, and used to generally understand the present disclosure. Furthermore, directional terms described by the present disclosure, such as top, bottom, front, rear, left, right, inner, outer, side, etc., are only directions by referring to the accompanying drawings, and thus the used terms are used only for the purpose of describing embodiments of the present disclosure and are not intended to be limiting of the present disclosure. In the drawings, modules with similar structures are labeled with the same reference number.

The present disclosure will be further described below with reference to the accompanying drawings and specific embodiments.

FIG. 1 is a flowchart of a method for manufacturing an array substrate according to an embodiment of the present disclosure. FIGS. 2A to 2E each is a schematic structural diagram of a manufacturing process of an array substrate according to an embodiment of the present disclosure.

Figure 2A:
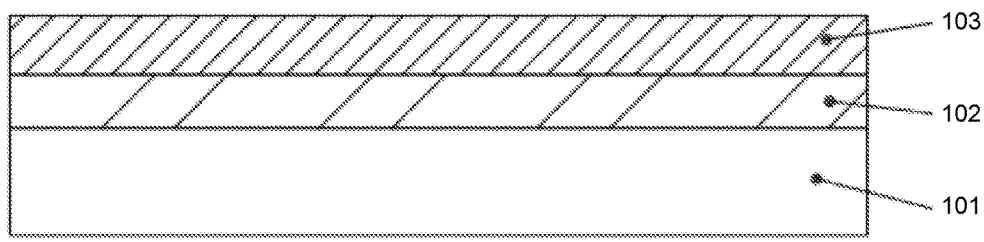
FIG. 2A is a schematic structural diagram of a manufacturing process of an array substrate according to an embodiment of the present disclosure.

Refer to FIG. 2A, a step S10 of providing a substrate 101 is provided.

The substrate 101 provided in the step S10 is generally a thin film transistor substrate including a substrate and a thin film transistor array. The substrate is a glass substrate.

A step S20 of depositing a passivation layer 102 on a surface of the substrate 101 is provided.

In the step S20, the passivation layer 102 is deposited on the surface of the substrate 101 using vapor deposition, and the passivation layer 102 is made of one or both of silicon nitride and silicon oxide.

A step S30 of forming a water-soluble organic layer 103 on a surface of the passivation layer 102 is provided. The water-soluble organic layer 102 is made of water-soluble organic material including one or at least two of a hydroxyl group, an aldehyde group, a carboxyl group, an amino group, and a sulfonic acid group.

In an embodiment of the present disclosure, the water-soluble organic material is composed of 3,4-ethylenedioxythiophene polymer and polystyrene sulfonate. The 3,4-ethylenedioxythiophene polymer has a low solubility in water. After addition of water-soluble polystyrene sulfonate, the solubility of the water-soluble organic material is greatly increased. Water-soluble organic layers with different solubility are obtained by adjusting rations of 3,4-ethylenedioxythiophene polymer and polystyrene sulfonate, and the specific ratio is based on the actual situation.

Since the water-soluble organic layer 103 is made of water-soluble material, the water-soluble organic layer 103 is very easy to clean in a subsequent process, so as to greatly improve efficiency of subsequent peeling of a transparent electrode.

Figure 2B:
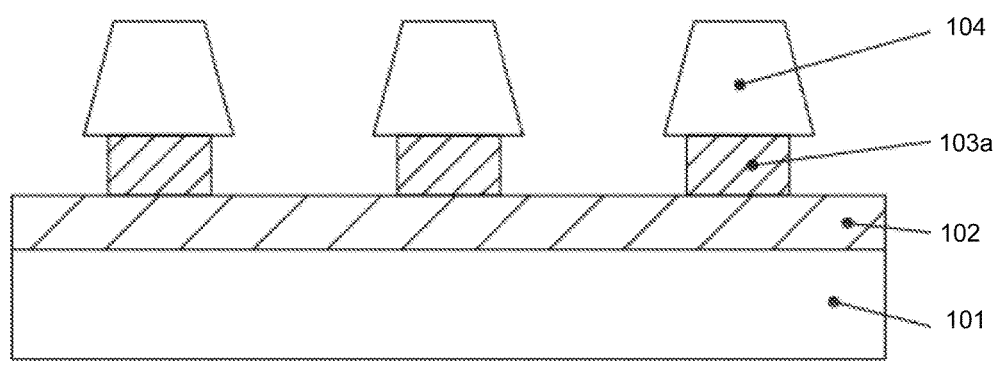
FIG. 2B is a schematic structural diagram of a manufacturing process of an array substrate according to an embodiment of the present disclosure.

Refer to FIG. 2B, a step S40 of coating a photoresist layer on a surface of the water-soluble organic layer, exposing and developing the photoresist layer to form a photoresist layer pattern and a water-soluble organic layer pattern is provided. The photoresist layer pattern includes a plurality of photoresist areas 104 disposed at intervals. The water-soluble organic layer pattern includes a plurality of water-soluble organic areas 103a disposed at intervals. Each of the photoresist areas 104 is disposed on one of the water-soluble organic areas 103a. A cross-section of the water-soluble organic areas 103a is less than a cross-section of a bottom surface of the photoresist areas 104.

In the step S40, a yellow light process is performed first, that is, the photoresist layer is coated on the surface of the water-soluble organic layer 103 to expose and develop the photoresist layer to form the photoresist layer pattern and the water-soluble organic layer pattern. In etching process of the water-soluble organic layer 103 using a developer, a lateral etching of the water-soluble organic areas 103a using the developer causes the cross-section of the water-soluble organic areas 103a to be less than a cross-section of the photoresist areas 104. Therefore, the water-soluble organic material of the water-soluble organic area not protected by the photoresist layer is completely cleaned.

In the yellow light process, a halftone mask is used to expose the photoresist layer to form a via hole and to shape a slit electrode.

Figure 2C:
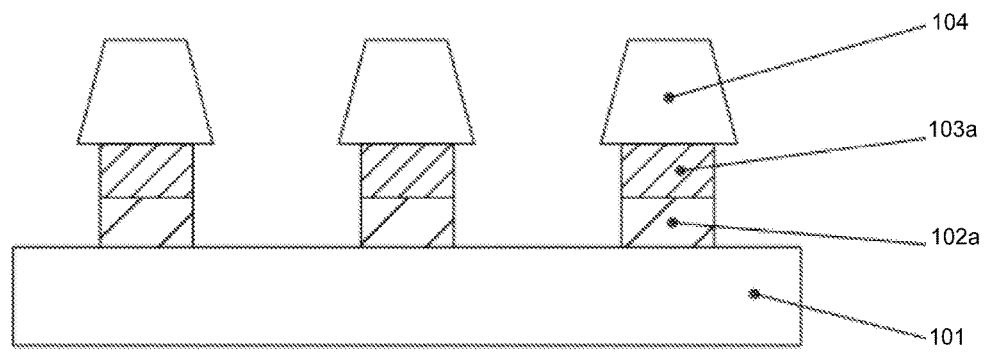
FIG. 2C is a schematic structural diagram of a manufacturing process of an array substrate according to an embodiment of the present disclosure.

Refer to FIG. 2C, a step S50 of dry etching the passivation layer 102 such that a cross-section of the passivation layer pattern is the same as a cross-section of the water-soluble organic layer pattern is provided.

In the step S50, the passivation layer 102 is dry etched to form the passivation layer area 102a. As the passivation layer 102 is dry etched, lateral etching of the water-soluble organic layer 103 using dry etching gas further reduces a cross-section of the water-soluble organic area 103a and enables the stripping solution to enter photoresist covering area in subsequent peeling of a transparent electrode, so as to improve peeling efficiency of the transparent electrode.

Figure 2D:
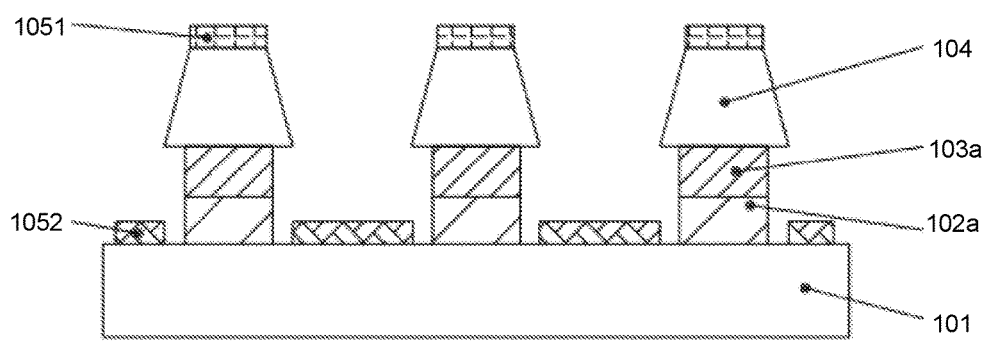
FIG. 2D is a schematic structural diagram of a manufacturing process of an array substrate according to an embodiment of the present disclosure.

Refer to FIG. 2D, a step S60 of depositing a transparent electrode on the substrate 101 is provided. The transparent electrode includes a first electrode 1052 covering the surface of the substrate 101 and a second electrode 1052 covering a surface of the photoresist layer pattern.

Due to undercut, the transparent electrode is disconnected at the undercut, which provides favorable conditions for the stripping solution to smoothly dissolve the water-soluble organic layer pattern.

Figure 2E:
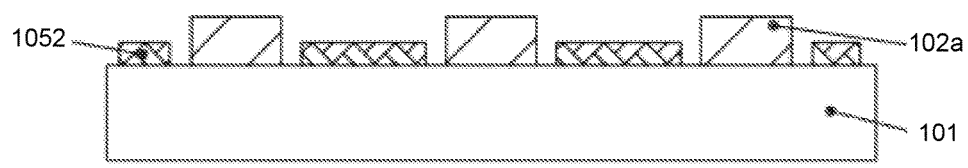
FIG. 2E is a schematic structural diagram of a manufacturing process of an array substrate according to an embodiment of the present disclosure.

Refer to FIG. 2E, a step S70 of peeling off the water-soluble organic layer pattern and the photoresist layer pattern, and removing the second electrode to pattern the transparent electrode is provided.

In the step S70, the stripping solution smoothly dissolves the water-soluble organic layer pattern, so as to peel off the photoresist layer pattern and the second electrode 1051 disposed on the water-soluble organic layer pattern to complete patterning of the transparent electrode.

Another aspect of the present disclosure further provides a method of manufacturing a display device including a method of manufacturing an array substrate and a method of manufacturing a color filter substrate, the method of manufacturing the array substrate includes:

a step S10 of providing a substrate;

a step S20 of depositing a passivation layer on a surface of the substrate;

a step S30 of forming a water-soluble organic layer on a surface of the passivation layer, wherein the water-soluble organic layer is made of water-soluble organic material;

a step S40 of coating a photoresist layer on a surface of the water-soluble organic layer, exposing and developing the photoresist layer to form a photoresist layer pattern and a water-soluble organic layer pattern, wherein the photoresist layer pattern includes a plurality of photoresist areas disposed at intervals, the water-soluble organic layer pattern includes a plurality of water-soluble organic areas disposed at intervals, each of the photoresist areas is disposed on one of the water-soluble organic areas, and a cross-section of the water-soluble organic area is less than a cross-section of a bottom surface of the photoresist area;

a step S50 of dry etching the passivation layer such that a cross-section of the passivation layer pattern is the same as a cross-section of the water-soluble organic layer pattern;

a step S60 of depositing a transparent electrode on the substrate, wherein the transparent electrode includes a first electrode covering the surface of the substrate and a second electrode covering a surface of the photoresist layer pattern; and a step S70 of peeling off the water-soluble organic layer and the photoresist layer, and removing the second electrode to pattern the transparent electrode.

The principle of the method of manufacturing the display device in the embodiment is the same as the principle of the method of manufacturing the array substrate. For details, reference may be made to the principle of the method of manufacturing the array substrate according to the above embodiments, and details are not described herein again.

An embodiment of the present invention provides the method of manufacturing the array substrate and the method of manufacturing the display device. The water-soluble organic layer is disposed on the surface of the passivation layer to increase an area of a peeling area such that the stripping solution can dissolve the water-soluble organic layer. The photoresist and the transparent electrode covering the water-soluble organic layer enhance peeling efficiency of the transparent electrode.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A method of manufacturing an array substrate, comprising:
    a step S10 of providing a substrate;
    a step S20 of depositing a passivation layer on a surface of the substrate;
    a step S30 of forming a water-soluble organic layer on a surface of the passivation layer, wherein the water-soluble organic layer is made of water-soluble organic material comprising one or at least two of a hydroxyl group, an aldehyde group, a carboxyl group, an amino group, and a sulfonic acid group;
    a step S40 of coating a photoresist layer on a surface of the water-soluble organic layer, exposing and developing the photoresist layer to form a photoresist layer pattern and a water-soluble organic layer pattern, wherein the photoresist layer pattern comprises a plurality of photoresist areas disposed at intervals, the water-soluble organic layer pattern comprises a plurality of water-soluble organic areas disposed at intervals, each of the photoresist areas is disposed on one of the water-soluble organic areas, and a cross-section of the water-soluble organic area is less than a cross-section of a bottom surface of the photoresist area;
    a step S50 of dry etching the passivation layer such that a cross-section of the passivation layer pattern is the same as a cross-section of the water-soluble organic layer pattern;
    a step S60 of depositing a transparent electrode on the substrate, wherein the transparent electrode comprises a first electrode covering the surface of the substrate and a second electrode covering a surface of the photoresist layer pattern; and
    a step S70 of peeling off the water-soluble organic layer pattern and the photoresist layer pattern, and removing the second electrode to pattern the transparent electrode.

2. The method according to claim 1, wherein the water-soluble organic material is composed of 3,4-ethylenedioxythiophene polymer and polystyrene sulfonate.

3. The method of manufacturing the array substrate according to claim 1, wherein when exposing and developing the photoresist layer, a lateral etching of the water-soluble organic area using a developer causes the cross-section of the water-soluble organic area to be less than a cross-section of the photoresist area, the photoresist area has a trapezoidal shape, and a top cross-section of the photoresist area is less than a bottom cross section of the photoresist area.

4. The method of manufacturing the array substrate according to claim 1, wherein the step S50 comprises: etching the passivation layer using an etching gas such that the cross-section of the passivation layer pattern is the same as the cross-section of the water-soluble organic layer pattern, while etching the water-soluble organic layer using the etching gas such that the cross-section of the water-soluble organic layer pattern is further reduced.

5. The method of manufacturing the array substrate according to claim 1, wherein the step S70 comprises: peeling off the water-soluble organic layer pattern, the photoresist layer pattern, and the second electrode using a stripping solution, wherein the water-soluble organic layer pattern is dissolved in the stripping solution.

6. A method of manufacturing a display device comprising a method of manufacturing an array substrate and a method of manufacturing a color filter substrate, the method of manufacturing the array substrate comprising:
    a step S10 of providing a substrate;
    a step S20 of depositing a passivation layer on a surface of the substrate;
    a step S30 of forming a water-soluble organic layer on a surface of the passivation layer, wherein the water-soluble organic layer is made of water-soluble organic material;
    a step S40 of coating a photoresist layer on a surface of the water-soluble organic layer, exposing and developing the photoresist layer to form a photoresist layer pattern and a water-soluble organic layer pattern, wherein the photoresist layer pattern comprises a plurality of photoresist areas disposed at intervals, the water-soluble organic layer pattern comprises a plurality of water-soluble organic areas disposed at intervals, each of the photoresist areas is disposed on one of the water-soluble organic areas, and a cross-section of the water-soluble organic area is less than a cross-section of a bottom surface of the photoresist area;
    a step S50 of dry etching the passivation layer such that a cross-section of the passivation layer pattern is the same as a cross-section of the water-soluble organic layer pattern;
    a step S60 of depositing a transparent electrode on the substrate, wherein the transparent electrode comprises a first electrode covering the surface of the substrate and a second electrode covering a surface of the photoresist layer pattern; and
    a step S70 of peeling off the water-soluble organic layer and the photoresist layer, and removing the second electrode to pattern the transparent electrode.

7. The method of manufacturing the display device according to claim 6, wherein the water-soluble organic material comprises one or at least two of a hydroxyl group, an aldehyde group, a carboxyl group, an amino group, and a sulfonic acid group.

8. The method of manufacturing the display device according to claim 7, wherein the water-soluble organic material is composed of 3,4-ethylenedioxythiophene polymer and polystyrene sulfonate.

9. The method of manufacturing the display device according to claim 6, wherein when exposing and developing the photoresist layer, a lateral etching of the water-soluble organic area using a developer causes the cross-section of the water-soluble organic area to be less than a cross-section of the photoresist area, the photoresist area has a trapezoidal shape, and a top cross-section of the photoresist area is less than a bottom cross section of the photoresist area.

10. A method of manufacturing an array substrate, comprising:
    a step S10 of providing a substrate;
    a step S20 of depositing a passivation layer on a surface of the substrate;

a step S30 of forming a water-soluble organic layer on a surface of the passivation layer, wherein the water-soluble organic layer is made of water-soluble organic material;

a step S40 of coating a photoresist layer on a surface of the water-soluble organic layer, exposing and developing the photoresist layer to form a photoresist layer pattern and a water-soluble organic layer pattern, wherein the photoresist layer pattern comprises a plurality of photoresist areas disposed at intervals, the water-soluble organic layer pattern comprises a plurality of water-soluble organic area disposed at intervals, each of the photoresist areas is disposed on one of the water-soluble organic areas, and a cross-section of the water-soluble organic area is less than a cross-section of a bottom surface of the photoresist area;

a step S50 of dry etching the passivation layer such that a cross-section of the passivation layer pattern is the same as a cross-section of the water-soluble organic layer pattern;

a step S60 of depositing a transparent electrode on the substrate, wherein the transparent electrode comprises a first electrode covering the surface of the substrate and a second electrode covering a surface of the photoresist layer pattern; and a step S70 of peeling off the water-soluble organic layer pattern and the photoresist layer pattern, and removing the second electrode to pattern the transparent electrode.

11. The method of manufacturing the array substrate according to claim 10, wherein the water-soluble organic material is composed of 3,4-ethylenedioxythiophene polymer and polystyrene sulfonate.

12. The method of manufacturing the array substrate according to claim 10, wherein when exposing and developing the photoresist layer, a lateral etching of the water-soluble organic area using a developer causes the cross-section of the water-soluble organic area to be less than a cross-section of the photoresist area, the photoresist area has a trapezoidal shape, and a top cross-section of the photoresist area is less than a bottom cross section of the photoresist area.

13. The method of manufacturing the array substrate according to claim 10, wherein the step S50 comprises: etching the passivation layer using an etching gas such that the cross-section of the passivation layer pattern is the same as the cross-section of the water-soluble organic layer pattern, while etching the water-soluble organic layer using the etching gas such that the cross-section of the water-soluble organic layer pattern is further reduced.

14. The method of manufacturing the array substrate according to claim 10, wherein the step S70 comprises: peeling off the water-soluble organic layer pattern, the photoresist layer pattern, and the second electrode using a stripping solution, wherein the water-soluble organic layer pattern is dissolved in the stripping solution.

* * * * *